United States Patent [19]

Husher et al.

[11] Patent Number: 5,404,029

[45] Date of Patent: Apr. 4, 1995

[54] ELECTRICALLY PROGRAMMABLE ANTIFUSE ELEMENT

[75] Inventors: John D. Husher, Los Altos Hills; Abdul R. Forouhi, San Jose, both of Calif.

[73] Assignee: Actel Corporation, Sunnyvale, Calif.

[21] Appl. No.: 790,366

[22] Filed: Nov. 12, 1991

Related U.S. Application Data

[63] Continuation-in-part of Ser. No. 604,779, Oct. 26, 1990, Pat. No. 5,181,096, which is a continuation-in-part of Ser. No. 508,306, Apr. 12, 1990, Pat. No. 5,070,384.

[51] Int. Cl.$^6$ .................... H01L 23/48; H01L 29/46; H01L 27/02; H01L 29/62

[52] U.S. Cl. ...................... 257/50; 257/530; 257/764

[58] Field of Search .............. 257/50, 530, 665

[56] References Cited

U.S. PATENT DOCUMENTS

| | | | |
|---|---|---|---|
| 4,322,822 | 3/1992 | McPherson | 257/409 |
| 4,499,557 | 2/1985 | Holmberg et al. | 257/368 |
| 4,602,420 | 7/1986 | Saito | 29/571 |
| 4,628,590 | 12/1986 | Udo et al. | 29/575 |
| 4,740,485 | 4/1988 | Sharpe-Geisler | 437/246 |
| 4,748,490 | 5/1988 | Hollinsworth | 257/530 |
| 4,823,181 | 4/1989 | Mohsen et al. | 257/530 |
| 4,899,205 | 2/1990 | Hamdy et al. | 357/51 |
| 4,914,055 | 4/1990 | Gordon et al. | 437/192 |
| 4,943,538 | 7/1990 | Mohsen et al. | 437/52 |
| 5,061,646 | 10/1991 | Sivan et al. | 437/31 |
| 5,070,384 | 12/1991 | McCollum et al. | 257/530 |
| 5,087,958 | 2/1992 | Chen et al. | 357/51 |
| 5,100,827 | 3/1992 | Lytle | 257/530 |
| 5,113,238 | 5/1992 | Wang et al. | 257/344 |
| 5,120,679 | 6/1992 | Boardman et al. | 437/195 |
| 5,126,290 | 6/1992 | Lowrey et al. | 257/530 |
| 5,134,457 | 7/1992 | Hamdy et al. | 257/530 |
| 5,163,180 | 11/1992 | Eltoukhy et al. | 257/530 |
| 5,181,096 | 1/1993 | Forouhi | 257/50 |
| 5,272,369 | 12/1993 | Counge et al. | 257/352 |

FOREIGN PATENT DOCUMENTS

| | | |
|---|---|---|
| 0416903 | 3/1991 | European Pat. Off. . |
| 0500034 | 8/1992 | European Pat. Off. . |

OTHER PUBLICATIONS

IEEE Electron Device Letters, "A Sublithographic Anitfuse Structure for Field-Programmable Gate Array Applications," vol. 13, No. 1, Jan. 1992.

*Primary Examiner*—Robert P. Limanek
*Assistant Examiner*—David B. Hardy
*Attorney, Agent, or Firm*—D'Alessandro, Frazzini & Ritchie

[57] ABSTRACT

An antifuse according to the present invention includes a lower electrode formed from a first metal interconnect layer in an integrated circuit or the like. The lower electrode is disposed on an insulating surface. An inter-metal dielectric including an antifuse aperture disposed there lies over the inter-metal dielectric layer. The antifuse aperture extends through the inter-metal dielectric layer and also extends completely through the lower electrode. An antifuse material is disposed in the antifuse aperture. An upper electrode formed from a first metal interconnect layer is disposed over the antifuse material.

20 Claims, 5 Drawing Sheets

ELECTRICALLY PROGRAMMABLE ANTIFUSE ELEMENT

This application is a continuation-in-part of prior application Ser. No. 07/604,779, filed Oct. 26, 1990, now U.S. Pat. No. 5,181,096, which is a continuation-in-part of prior application Ser. No. 07/508,306, filed Apr. 12, 1990, now U.S. Pat. No. 5,070,384.

BACKGROUND OF THE INVENTION

1. Field of the Invention

The present invention relates to the field of integrated electronic circuit technology. More particularly, the invention relates to a reliable and manufacturable capacitor-like, electrically-programmable interconnect device to be used in integrated circuits.

2. The Prior Art

Integrated electronic circuits are usually made with all internal connections set during the manufacturing process. However, because of high development costs, long lead times, and high manufacturing tooling costs of such circuits, users often desire circuits which can be configured or programmed in the field. Such circuits are called programmable circuits and they usually contain programmable links. Programmable links are electrical interconnects which are either broken or created at selected electronic nodes by the user after the integrated device has been fabricated and packaged in order to inactivate or activate respectively the selected electronic nodes.

Programmable links which are open circuits until a current path is created by a user are called antifuses. Antifuses have been used in numerous types of user-programmable circuits. Antifuses typically consist of two electrodes formed from conductor and/or semiconductor materials having some kind of a dielectric or insulating material between them. During programing, the dielectric material at selected points in between the conductive materials is broken down by predetermined applied voltages, thereby electrically connecting the conducting or semiconducting materials together.

Various materials have been suggested for both the antifuse electrodes and the dielectric or insulating layers. Some of these suggested dielectric materials require a relatively high current and voltage during programming, require complex manufacturing techniques and have low reliability during programming because it is difficult to control the reproducability of the conductive state due to the nature of the materials involved. In addition, the programming process results in a link having a finite resistance in the order of several hundred to several thousand ohms. This characteristic of some known antifuse elements renders them relatively unsuitable for use in high speed circuits.

Lately, there has been much interest in antifuse elements disposed in layers above and insulated from the surface of the silicon substrate in an integrated circuit. Of particular interest in this regard are antifuse structures for use between two metal interconnect layers in integrated circuit structures. When the lower electrode for an antifuse is to be formed in layers above the semiconductor or other substrate, it is usually fabricated from a metal layer or a composite layer which may include a first metal layer and another layer such as silicon or another metal or barrier layer.

Two problems which must be addressed when fabricating an antifuse are the problem of assuring reliability and the separate-but-related problem of assuring manufacturability of many antifuses in a production environment. When the lower electrode of the antifuse is located in a layer above the surface of the substrate, such as a metal layer, planarity of the upper surface of the lower electrode becomes an issue. If the surface of the lower electrode is sufficiently non-planar, reliability and manufacturability problems may arise because the thickness of the antifuse dielectric, which determines programming voltage, and programming reliability margins, may not be controllable enough to allow design of a manufacturable and reliable product.

For example, if the lower electrode of an antifuse is fabricated from a layer of aluminum-silicon-copper (AlSiCu) alloy with various Si and Cu concentrations, its upper surface will be characterized by non-planar hillock formations as a result of its fabrication. If the hillocks are high enough, they will cause difficulties in selecting the thickness of the dielectric layer which will cover them. In addition, the tips of the hillocks will be sources of concentrated electric fields which may result in unpredictable and undesired programming of individual antifuses. In a typical metallization process, hillocks may range in height from about 0.5 to 2.0 microns and have fairly sharp tips, resulting in considerable and unpredictable field concentrations at the tips of the hillocks during programming.

A preferable solution to this problem would be to provide a structure which avoids the problems inherent in antifuse structures incorporating hillock formations but allows standard metallization techniques and materials to be employed in the antifuse fabrication process. A preferable antifuse structure would also exhibit a minimum capacitance in its unprogrammed state.

BRIEF DESCRIPTION OF THE INVENTION

According to the present invention, an electrically programmable antifuse may be fabricated on a semiconductor or other suitable substrate in layers located above the surface of the substrate, such as metal interconnect layers. According to a first aspect of the invention, an antifuse according to the present invention includes a lower electrode formed from a first metal interconnect layer in an integrated circuit or the like. The lower electrode is disposed on an insulating surface. An inter-metal dielectric including an antifuse aperture disposed therein lies over the first metal interconnect layer dielectric layer. The antifuse aperture extends through the inter-metal dielectric layer and also extends completely through the lower electrode. An antifuse material is disposed in the antifuse aperture. An upper electrode formed from a first metal interconnect layer is disposed over the antifuse material.

According to a second aspect of the present invention, an antifuse according to the present invention may be fabricated by a process including the steps of forming a lower electrode from a selected portion of a first metal interconnect layer disposed over a insulating layer, forming an inter-metal dielectric layer, forming an antifuse aperture completely through the inter-metal dielectric layer and the lower electrode to the underlying insulating layer, forming an antifuse dielectric material in the antifuse aperture, and forming an upper antifuse electrode comprising a selected portion of a second metal interconnect layer over the surface of the antifuse dielectric material.

According to a third aspect of the present invention, a reduced-capacitance antifuse according to the present invention includes a lower electrode formed from a first metal interconnect layer in an integrated circuit or the like. The lower electrode is disposed on an insulating surface. An inter-metal dielectric including an antifuse aperture disposed therein lies over the first metal interconnect layer dielectric layer. The antifuse aperture extends through the inter-metal dielectric layer and also extends completely through the lower electrode. The antifuse aperture is positioned such that it extends beyond the edge of the lower electrode and thus lies only partially over the lower electrode. An antifuse material is disposed in the antifuse aperture. An upper electrode formed from a first metal interconnect layer is disposed over the antifuse material.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

The present invention may be practiced using conventional semiconductor processing techniques. The details of these techniques are well understood by those of ordinary skill in the art and do not form part of the present invention. Such details have not been included herein to avoid overcomplicating the disclosure and to avoid obscuring the disclosure of the invention herein.

Figure 1:
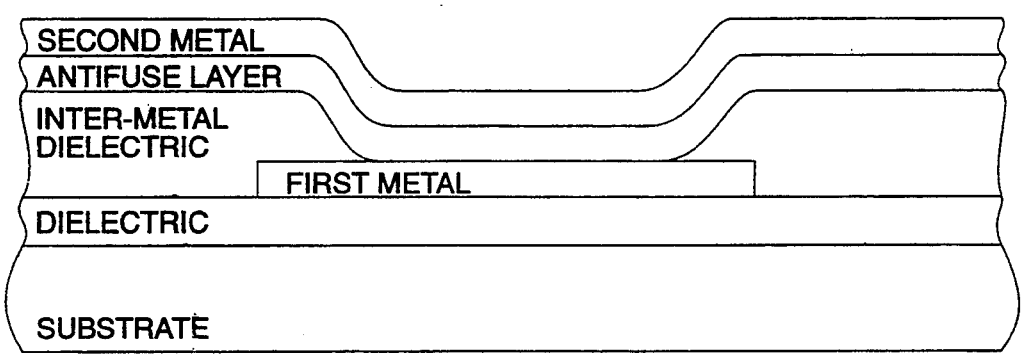
FIG. 1 is a cross sectional view of a typical prior art metal-to-metal antifuse structure.

Referring first to FIG. 1, a cross-sectional view of a typical metal-to- metal antifuse fabricated according to a prior art process is shown. The antifuse is fabricated between a first metal layer and a second metal layer. The first metal layer is disposed above and separated from the surface of the substrate by an inter-metal dielectric layer.

The antifuse of FIG. 1 is formed in an antifuse aperture formed in the inter-metal dielectric layer which separates the first metal and second metal layers. As may be seen from FIG. 1, the antifuse aperture is etched completely through the inter-metal dielectric layer to expose the upper surface of the first metal layer to make contact therewith.

An antifuse material layer is formed over the inter-metal dielectric layer in the region of the antifuse aperture and covers the first metal layer. The second metal layer is then formed over the antifuse material layer.

The antifuse of FIG. 1 is susceptible to problems resulting from non-planarity of the upper surface of the first metal layer. The hillock structures inherent in the first metal layer cause reliability problems in the antifuse structure. As previously mentioned, these problems include difficulties in selecting the thickness of the antifuse layer which will cover the hillocks and the concentrated electric fields which may be allowed to concentrate at the tops thereof, thus resulting in unpredictable and undesired programming of individual antifuses.

An antifuse structure fabricated according to the present invention utilizes standard integrated circuit metallization fabrication techniques, eliminates the problem of hillocks, shortens the process, and improves reliability and repeatability in programming. The antifuse of the present invention is thus less expensive, easier to produce, and more reliable than the present state of the art antifuses - mainly because it is more reproducible. Because the antifuse fabricated according to the present invention may be formed simultaneously with the formation of metal-to-metal contacts in an integrated circuit structure, the disclosure of the present invention shall include the steps illustrating the simultaneous formation of an exemplary metal-to-metal contact.

Figure 2A:
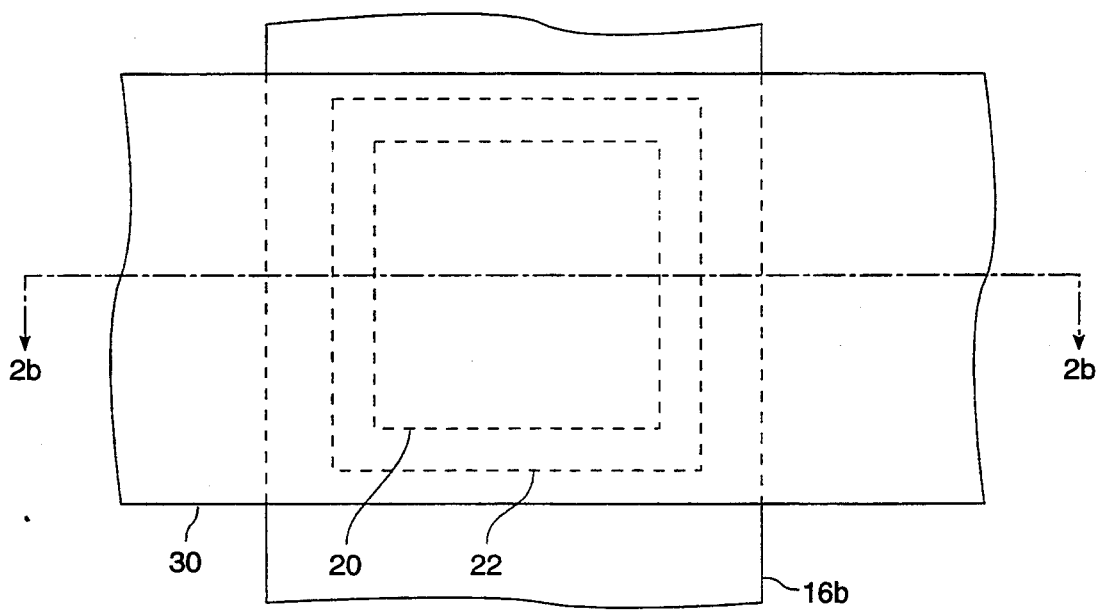
FIG. 2a is a top view of a metal-to-metal antifuse structure according to a first embodiment of the present invention.
Figure 2B:
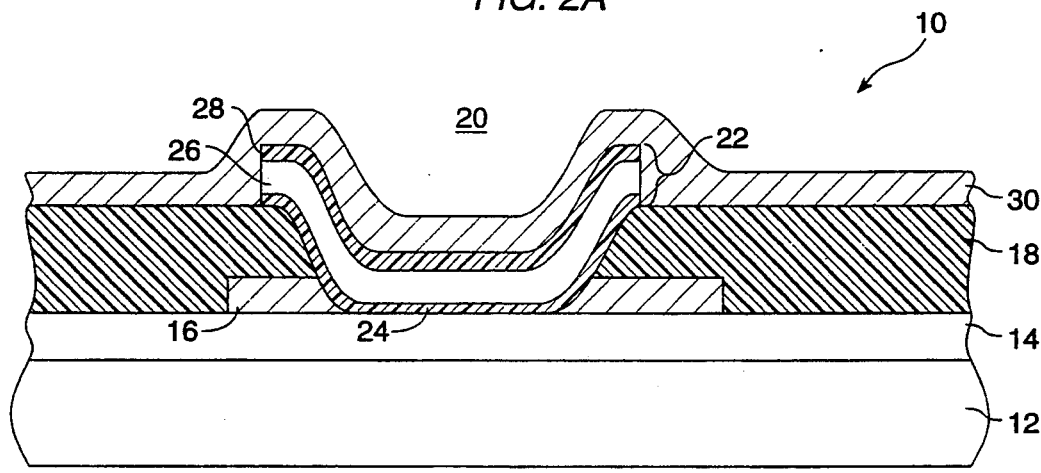
FIG. 2b is a cross sectional view of the metal-to-metal antifuse structure of FIG. 2a taken through lines 2b—2b.

Referring now to FIGS. 2a and 2b, corresponding top and cross-sectional view of a metal-to-metal antifuse structure according to a first embodiment of the present invention are shown (FIG. 2b is a cross sectional view of the metal-to-metal antifuse structure shown in top view in FIG. 2a taken through lines 2b—2b). An antifuse 10 fabricated according to a first aspect of the invention may be formed on a substrate 12. Substrate 12 may be a semiconductor substrate, such as silicon or GaAs, or, if the application warrants, may be a ceramic or other type substrate known to those of ordinary skill in the art. The choice of material for substrate 12 will be a design choice based upon the nature and application of the structures to be formed thereon in addition to the antifuses of the present invention.

According to a presently preferred embodiment, antifuse 10 of the present invention is situated between two metal interconnect layers in the integrated circuit structure, portions of which form the lower and upper antifuse electrodes. An underlying insulating layer 14, which may comprise one of the numerous dielectric materials employed in semiconductor structures, and which may be formed using conventional semiconductor processing techniques, is formed over the surface of the substrate. In a typical process, insulating layer 14 will comprise a layer of silicon dioxide, formed by a CVD process to a thickness in the range of from about 5,000 to 15,000 Å. This layer is typically employed under the first metal interconnect layer in a semiconductor structure and is thus well known to those of ordinary skill in the art. Those of ordinary skill in the art will recognize that, in instances where substrate 12 comprises an insulating material, underlying insulating layer 14 may be unnecessary, and either no underlayer or a layer to promote adhesion of first metal interconnect layer 16 to substrate 12 may be provided.

First metal interconnect layer 16 is formed using conventional materials and processing techniques. First metal interconnect layer 16 may be formed from materials compatible with VLSI CMOS processes, such as AlSi or AlSiCu alloys, and multilayer films such as TiW/AlSiCu/TiW, but those of ordinary skill in the art will recognize that other conductive materials will function as well. Typical thicknesses for first metal interconnect layer 16 are in the range of from about 5,000 to 10,000 Å.

An inter-metal dielectric layer 18 is formed over first metal interconnect layer 16. The well-known function of inter-metal dielectric layer 18 is to separate metal interconnect layers in a multi-level metal interconnect process. Inter-metal dielectric layer 18 is usually formed from silicon dioxide to a thickness of about from 10,000 to 15,000. It is desirable to have a relatively thick layer of inter-metal dielectric in order to minimize the capacitance of unprogrammed antifuses as well as to minimize capacitive coupling between the metal interconnect lines.

The antifuse 10 is located in an antifuse aperture 20 formed in inter-metal dielectric layer 18. Unlike the antifuse apertures formed for prior art antifuses, the antifuse aperture 20 formed for the antifuse 10 of the present invention also extends through first metal interconnect layer 16. Conventional wet or dry etching techniques may be used to form antifuse aperture 20, and techniques, such as those disclosed in applications Ser. Nos. 07/508,303, filed Apr. 12, 1990, now U.S. Pat. No. 5,057,451 and 07/687,437, filed Apr. 18, 1991, may be used to minimize the size of antifuse aperture 20 to further reduce the capacitance of unprogrammed antifuses. These applications are expressly incorporated herein by reference.

Antifuse material layer 22 is formed over inter-metal dielectric layer 18 and in antifuse aperture 20. Antifuse material layer 22 may be one of a number of materials currently used for antifuse fabrication, including but not limited to one or more oxide/nitride layers, amorphous silicon, or a composite layer including a first layer of amorphous silicon covered by a second layer of silicon nitride. In such an embodiment, a first layer of amorphous silicon is formed by PECVD techniques to a thickness of about between 500 to 2,000 Å, followed by formation of a layer of silicon nitride as will be disclosed herein.

As presently preferred, antifuse material layer 22 may be a multilayer sandwich structure including a first dielectric layer 24 comprising a layer of a generic silicon nitride $Si_xN_y$:H, produced by a CVD method such as PECVD or LPCVD. In a presently preferred embodiment, the first dielectric layer 24 may have a thickness in the range of from between about 50 to 300 Å.

Those of ordinary skill in the art will recognize that other dielectric materials, such as $Si_3N_4$, $SiO_2$, silicon oxynitride and suboxide of silicon ($SiO_x$) and other dielectric materials compatible with semiconductor processing techniques may be used for the first dielectric layer, and depending on the material chosen for first metal interconnect layer 16, an adhesion promoting layer may be utilized if necessary.

A layer 26 of doped or undoped silicon film, preferably produced by known CVD or sputtering techniques, is disposed over the first dielectric layer 24 and in the antifuse aperture 20. In a presently preferred embodiment, this antifuse layer 26 may be formed of hydrogenated amorphous silicon (a-Si:H), amorphous silicon (a-Si), or polycrystalline silicon, and may have a thickness in the range of about between 1,000 to 5,000 Å. If desired, the antifuse layer 26 may be lightly doped with boron, phosphorus or arsenic to a level, for example, of about $1 \times 10^{14}$ atoms/cm$^3$ for the purpose of stabilizing the microstructure of the amorphous silicon.

A second dielectric layer 28, similar to the first dielectric layer 24, is formed on the surface of the antifuse layer 26 using a CVD method such as PECVD or LPCVD. The materials used for the second dielectric layer 28 may be any of the materials from which the first dielectric layer 24 is formed. The first and second dielectric layers 24 and 28 need not be made of the same material.

The employment of the composite interlayer 22 comprising first and second dielectric layers 24 and 28 and an antifuse layer 26 as disclosed herein enables the use of a process where the dielectric and antifuse layers can be sequentially deposited in the same CVD reactor or sputtering system without breaking the vacuum, thus increasing throughput and minimizing contamination. The employment of such a composite layer also has the advantage of substantially eliminating parasitic capacitances and leakage currents which are so common in prior art antifuse elements. The parasitic capacitance may be substantially eliminated because of the increased spacing between the lower and upper electrodes afforded by the composite dielectric and amorphous silicon interlayer.

It will be appreciated that use of an antifuse layer in combination with adjacent dielectric layers also has the advantage of substantially eliminating defect densities such as crack propagation, continuity failure, and other structural defects which cause leakage currents since such defects would have to appear simultaneously at the same point in both the dielectric layers and the antifuse layer, a highly unlikely event. Thus, the novel combination of dielectric layers and the antifuse layer interposed between them provides greatly enhanced antifuse reliability than is possible with most antifuse structures.

It is presently preferred to perform the deposition of both a-Si:H and $Si_xN_y$:H at a temperature of about 380° C. although it is believed that the temperature may range from about 200°–450° C. It is also presently preferred that the hydrogen content of the a-Si:H be about 10%, although it is presently believed that ranges from about 5–40% will result in a functional antifuse. In addition, the composition of $Si_xN_y$:H is preferably one in which $x=3$ and $y=4$, although silicon rich compositions are believed to be satisfactory. The preferred hydrogen content of the $Si_xN_y$:H is about 10%, although it is presently believed that ranges from about 5–40% will result in a functional antifuse.

Those of ordinary skill in the art will note that, unlike prior art antifuses in which the antifuse material layer rests on top of first metal interconnect layer 16, antifuse material layer 22 in antifuse 10 of the present invention rests over the surface of insulating layer 14 and contacts first metal interconnect layer 16, which has been etched away in antifuse aperture 20, only at its vertical sides at the periphery of antifuse aperture 20. By etching antifuse aperture 20 through first metal interconnect layer 16 down to the underlying layer, any hillock structures which would otherwise be present at the interface of first metal interconnect layer 16 and antifuse material layer 22 are eliminated.

Finally, second metal interconnect layer 30 is formed over antifuse material layer 22 using conventional semiconductor processing techniques. Second metal interconnect layer 30 may typically be formed from a conductive material compatible with VLSI CMOS processes, such as AlSi or AlSiCu alloys and multilayer structures such as TiW/AlSiCu/TiW, but those of ordinary skill in the art will recognize that other conductive materials will function as well. Typical thicknesses for second metal interconnect layer 30 are in the range of from about 5,000 to 15,000 Å.

From the foregoing discussion, those of ordinary skill in the art will recognize that, in certain embodiments of the antifuse described herein, barrier layers will be needed to prevent diffusion of metal atoms into the antifuse material layer, especially in embodiments where only a single amorphous silicon antifuse layer is employed. Such design considerations are well within the ordinary level of skill in the art.

A process for fabricating antifuse 10 according to the present invention is compatible with double-layer metallization formation techniques currently-employed MOS and CMOS semiconductor fabrication processes. A presently preferred process is illustrated in FIGS. 3a—3e, cross sectional views of the antifuse 10 of FIGS. 2a and 2b are presented showing the antifuse structure existing at various points in the process. Since the process used to fabricate the antifuse 10 according to the present invention is performed during the steps used to form the first and second metal interconnect layers of the integrated circuit containing antifuse 10, FIGS. 3a—3e also show the progressive corresponding structure of the metal interconnect formation and contact process.

Figure 3A:
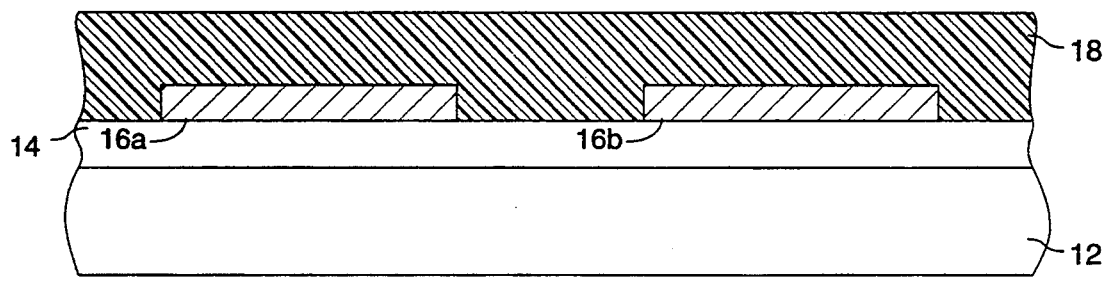
FIGS. 3a—3e are cross-sectional views of the structure of the antifuse of FIGS. 2a and 2b shown at various points in the fabrication process, along with corresponding cross-sectional views of the structure of a simultaneously formed metal-to-metal contact.

First, as may be seen in FIG. 3a, a cross sectional view is shown of the semiconductor structure prior to the steps performed to fabricate the antifuse 10. The process module for fabricating antifuse 10 according to the present invention begins after substrate 12 has been covered by insulating layer 14 and a first metal interconnect layer 16 has been formed and defined using conventional semiconductor processing techniques. FIG. 3a shows that the first metal interconnect layer has been divided into two illustrative portions 16a and 16b. The region 16a of the first metal layer will be used to form a conventional inter-metal contact and the region 16b of the first metal layer will form the lower electrode of an antifuse 10.

According to FIG. 3a, inter-metal dielectric layer 18 has also been formed in the usual manner. As previously noted, the presence of insulating layer 14 in the process may depend on the nature of substrate 12.

Those of ordinary skill in the art will recognize that the structure depicted in FIG. 3a is typically encountered in conventional semiconductor processing after formation of first metal and an inter-metal dielectric layer. In a conventional process, the next step would be to form inter-metal vias for establishing connections between region 16a of the first metal layer and a second metal layer prior to forming the second metal layer. According to the presently preferred embodiment of the invention, however, the antifuse apertures are formed first.

Figure 3B:
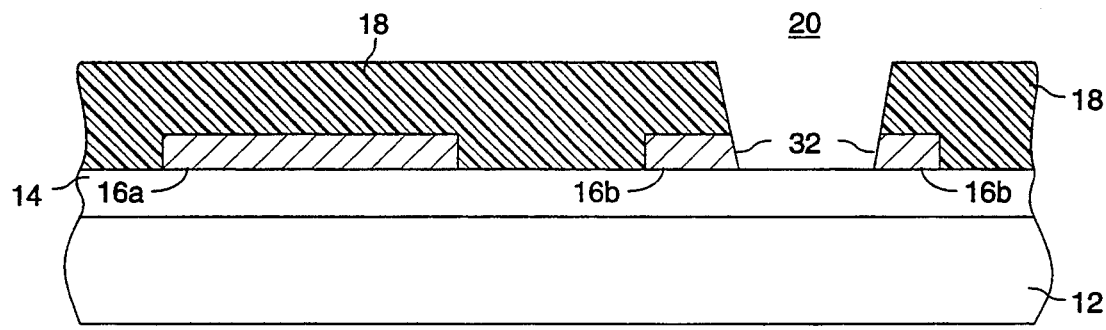

Referring now to FIG. 3b, an antifuse aperture 20 is etched through both inter-metal dielectric layer 18 and region 16b of the first metal layer to the upper surface of dielectric layer 14 covering the surface of substrate 12. This step is unlike the typical prior art metal-to-metal antifuse fabrication processes, which teach forming an antifuse aperture only in layers above region 16b of the first metal layer and thus teach away from etching through region 16b of the first metal layer.

Because region 16b of the first metal layer is etched through to the underlying dielectric layer 14, the etching step removes the hillock formations and leaves exposed the side portions 32 of region 16b of the first metal layer only at the periphery of the antifuse aperture regardless of its shape. The exposed side portions 32 of the first layer metal are devoid of hillocks and the antifuse 10 of the prior invention is thus free from the problems caused by hillock structures.

Figure 3C:
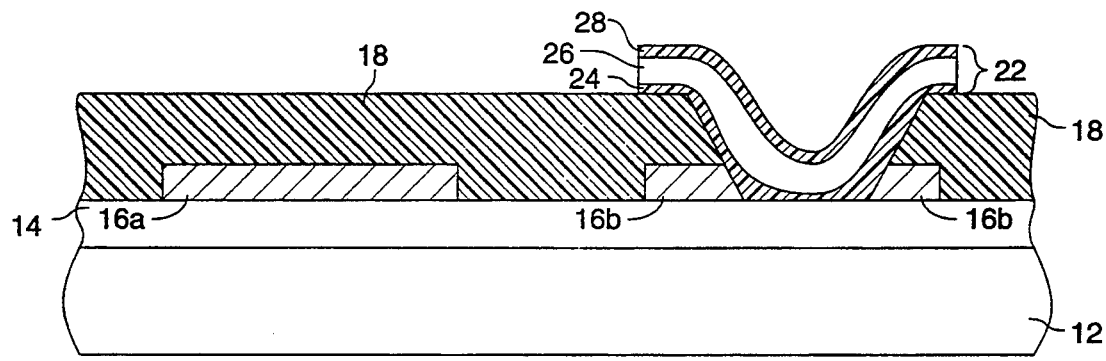

Referring now to FIG. 3c, antifuse material layer 22 is first formed over inter-metal dielectric layer 18 and defined using conventional masking and etching steps so that it remains only in the region of antifuse aperture 20. A composite antifuse layer including a layer of amorphous silicon sandwiched between two dielectric layers as described herein will produce an antifuse having a programming voltage in the range of between about 5 and 25 volts, depending upon the selection of materials and their respective thicknesses. Those of ordinary skill in the art will be readily able to determine the approximate programming voltage for a particular embodiment, given its structure.

In accordance with the present invention, the processing steps used to form the composite antifuse material may be carried out in the same reactor. The antifuse material is then defined using conventional photolithography and etching steps.

Figure 3D:
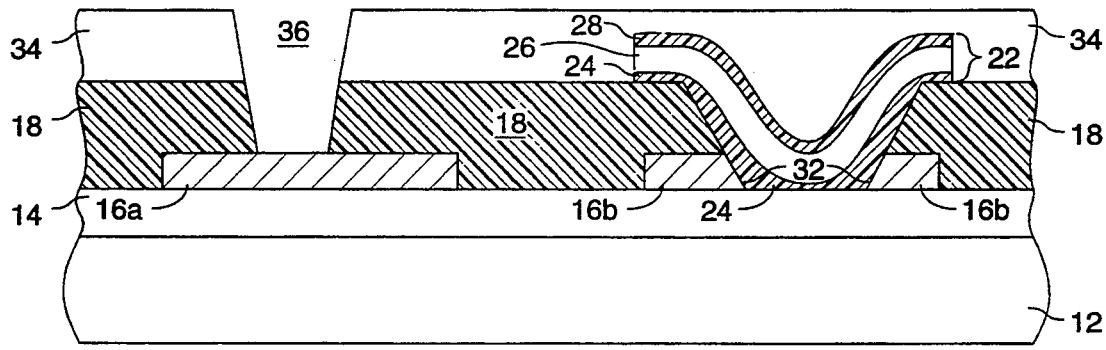

Once the antifuse material 22 has been defined, the process interfaces with conventional metallization processes as shown in FIG. 3d. First, the antifuse areas are masked by covering them with a layer of photoresist 34 which also defines inter-metal vias 34. This mask is already employed in a double layer metal interconnect process. Inter-metal vias 36 are then formed using a conventional etching step to expose region 16a of the first metal layer.

Figure 3E:
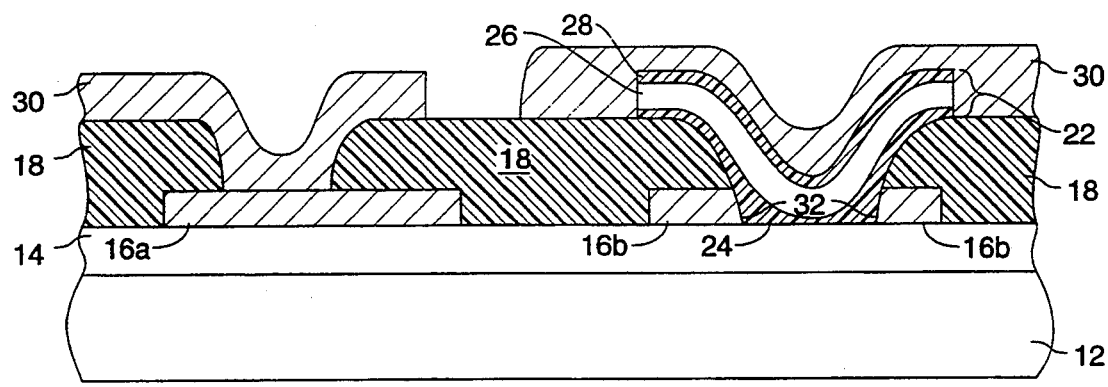

Finally, as shown in FIG. 3e, resist layer 34 is removed and 30 is formed and patterned second metal interconnect. The structure of antifuse 10 is shown completed in FIG. 3e along with inter-metal connections in region 16a of the first metal layer.

Figure 4A:
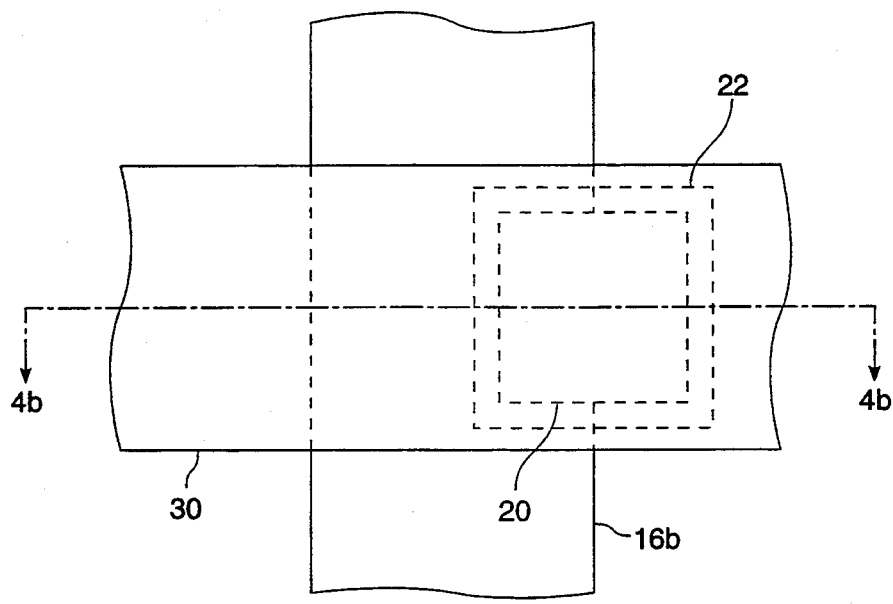
FIG. 4a is a top view of a metal-to-metal antifuse structure having reduced capacitance fabricated according to a second embodiment of the present invention.
Figure 4B:
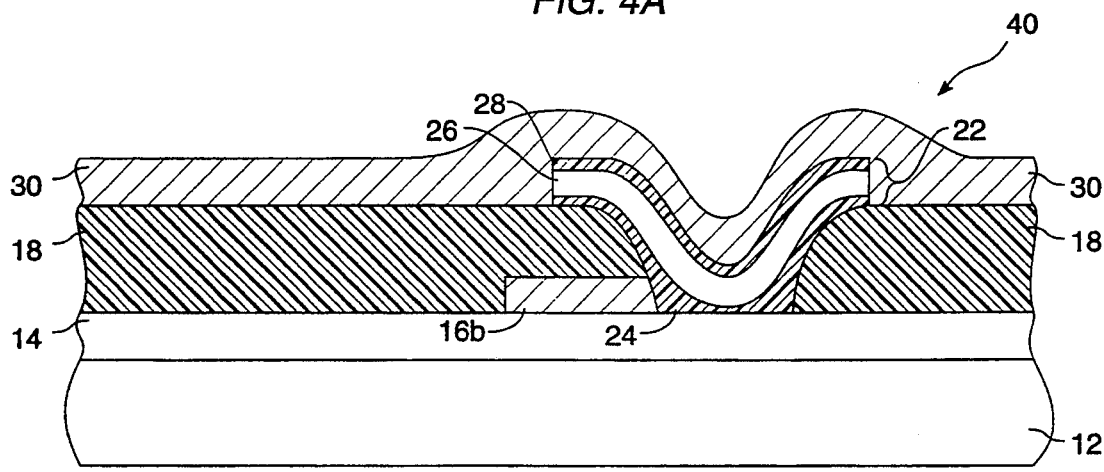
FIG. 4b is a cross sectional view of the metal-to-metal antifuse structure of FIG. 4a taken through lines 4b—4b.

According to a second embodiment of the present invention, an antifuse having reduced capacitance in its unprogrammed state is fabricated using the same principles as disclosed with respect to the first embodiment herein. Referring now to FIGS. 4a and 4b, the structure of this antifuse 40 according to the second embodiment of the invention can be seen to differ in some respects from the antifuse 10 of the first embodiment. FIGS. 4a and 4b are, respectively, a top view and a cross-sectional view of antifuse 40. FIG. 4b is taken at lines 4b—4b of FIG. 4a.

Like the embodiment illustrated in FIGS. 2a and 2b, antifuse 40 may be formed on a substrate 12. Like antifuse 10, antifuse 40 of the present invention is situated between two metal interconnect layers in the integrated circuit structure, portions of which form the lower and upper antifuse electrodes. An underlying insulating layer 14 may be provided if substrate 12 is not formed from an insulating material.

As in the embodiment illustrated in FIGS. 2a and 2b, first metal interconnect layer 16 is formed using conventional materials and processing techniques. An inter-metal dielectric layer 18 is formed over first metal interconnect layer 16, and an antifuse aperture 20 is formed in the inter-metal dielectric layer 18.

It is desirable to minimize the capacitance of unprogrammed antifuses. According to the embodiment of the invention illustrated in FIGS. 4a and 4b, antifuse aperture 20 is positioned so as to only partially overlap first metal interconnect layer 16. Those of ordinary skill in the art will recognize that this geometry results in antifuse 40 having a smaller capacitance in its unprogrammed state than antifuse 10, due to the smaller area of the first interconnect layer 16 to act as a capacitor plate.

Like the antifuse aperture formed for antifuse 10, the antifuse aperture 20 formed for antifuse 40 of the present invention also extends through first metal interconnect layer 16b. Conventional wet or dry etching techniques may be used to form antifuse aperture 20, and techniques, such as those disclosed in applications Ser. Nos. 07/508,303, filed Apr. 12, 1990 and 07/687,437, filed Apr. 18, 1991, may be used to minimize the size of antifuse aperture 20 to further reduce the capacitance of unprogrammed antifuses.

Antifuse material layer 22 is formed over inter-metal dielectric layer 18. Antifuse material layer 22 in antifuse 40 of the present invention also rests over the surface of dielectric layer 14 and contacts first metal interconnect layer 16b, which has been etched away in antifuse aperture 20, only at its sides at the periphery of antifuse aperture 20, thus avoiding the hillock structures and their accompanying drawbacks.

Finally, second metal interconnect layer 30 is formed over antifuse material layer 22 using conventional semiconductor processing techniques. Like the second metal interconnect layer in antifuse 10, second metal interconnect layer 30 in antifuse 40 may typically be formed from a conductive material compatible with VLSI CMOS processes, such as AlSi or AlSiCu alloys, multilayers such as TiW/AlSiCu/TiW, or other conductive materials.

A process for fabricating antifuse 40 according to the present invention is also compatible with double-layer metallization formation techniques currently-employed MOS and CMOS semiconductor fabrication processes. A presently preferred process is illustrated in FIGS. 5a–5e, in which cross sectional views of the antifuse 40 of FIGS. 4a and 4b are presented showing the antifuse structure existing at various points in the process. Those of ordinary skill in the art will recognize that, aside from locating the mask features for the antifuse aperture 20 such that the aperture does not completely overlap first layer metal interconnect region 16b, the process is identical to the process described with reference to FIGS. 3a–3e. To avoid needless repetition, the process illustrated in FIGS. 5a–5e will be only briefly discussed.

Figure 5A:
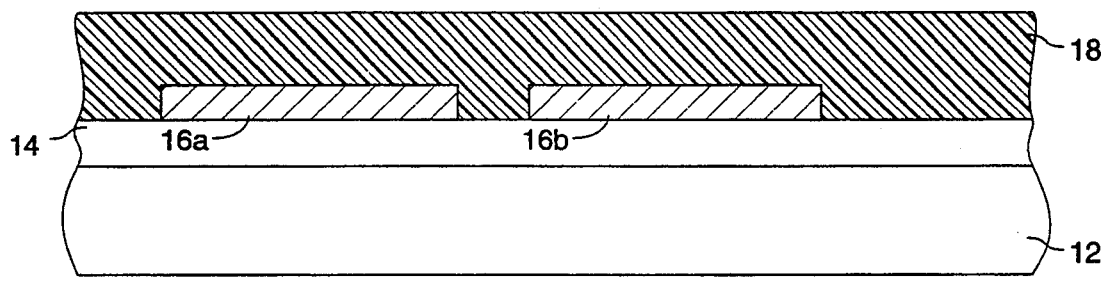
FIGS. 5a—5a are cross-sectional views of the structure of the antifuse of FIGS. 4a and 4b shown at various points in the fabrication process, along with corresponding cross-sectional views of a simultaneously formed metal-to-metal contact.

First, as may be seen in FIG. 5a, substrate 12 has been covered by insulating layer 14 and a first metal interconnect layer has been formed and defined into portions 16a and 16b, for use as a metal interconnect contact point and an antifuse, respectively. An inter-metal dielectric layer 18 has also been formed in the usual manner.

Figure 5B:
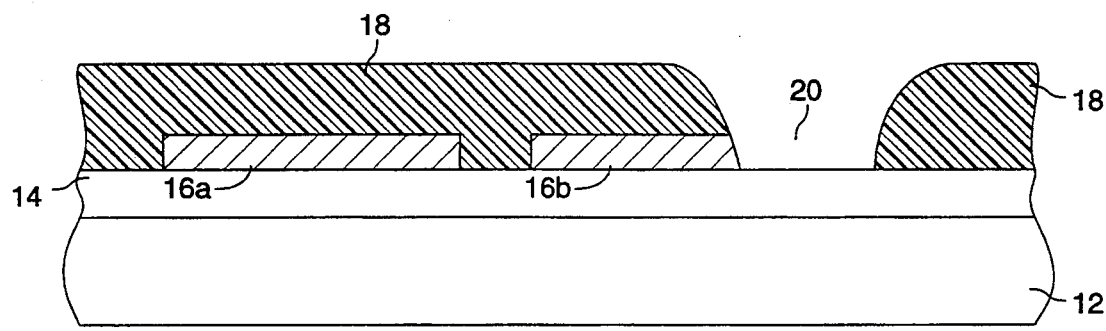

Referring now to FIG. 5b, an antifuse aperture 20 is etched in inter-metal dielectric layer, through region 16b of the first metal layer to the upper surface of insulating layer 14 covering the surface of substrate 12. This step is unlike the typical prior art metal-to-metal antifuse fabrication processes, which teach forming an antifuse aperture only in layers above region 16b of the first metal layer and thus teach away from etching through region 16b of the first metal layer. In addition, in contrast to the embodiment illustrated in FIGS. 2a and 2b, antifuse aperture 20 of antifuse 40 does not lie completely over first level metal interconnect layer 16b.

Figure 5C:
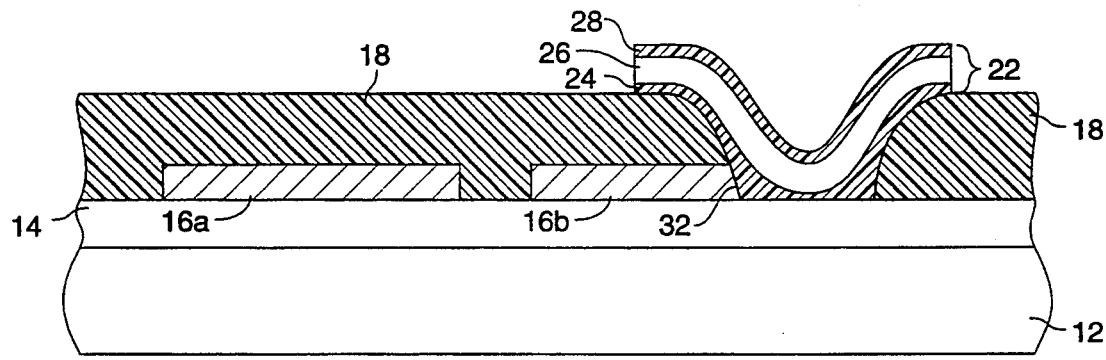

Referring now to FIG. 5c, antifuse material layer 22 is formed in antifuse aperture 20. Since region 16b of the first metal layer, including its hillock formations, has been etched through to the underlying dielectric layer 14, only the side portion 32 of region 16b of the first metal layer at the periphery of the antifuse aperture 20 are exposed regardless of the shape of antifuse aperture 20. The exposed portion 32 of the first layer metal are devoid of hillocks.

Figure 5D:
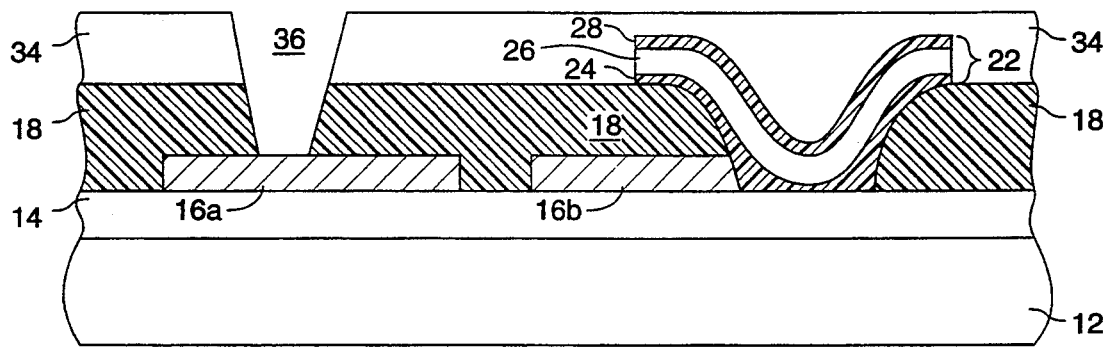

Once the antifuse material 22 has been defined, the process interfaces with conventional metallization processes as shown in FIG. 5d. First, the antifuse areas are masked by covering them with a layer of photoresist 34 which defines inter-metal vias 36. Inter-metal vias 36 are then formed using a conventional etching step to expose region 16a of the first metal layer.

Figure 5E:
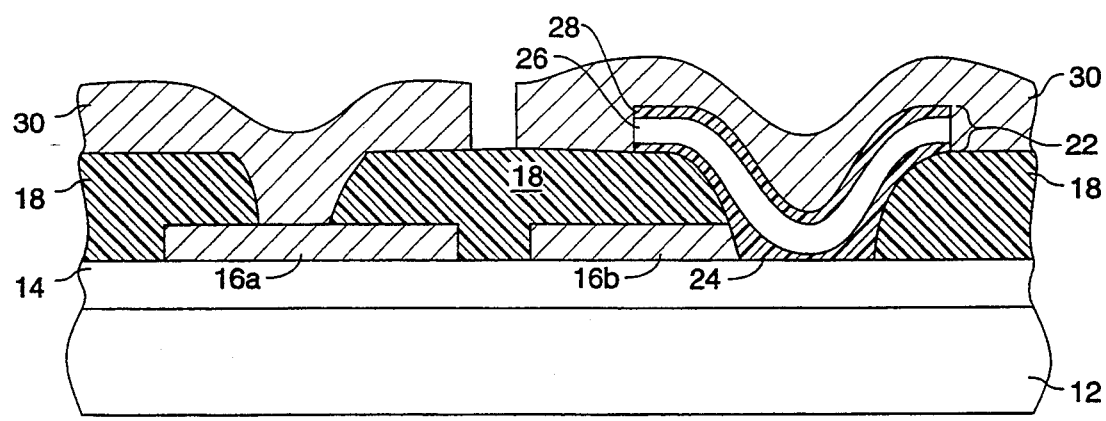

Finally, as shown in FIG. 5e, resist layer 34 is removed and second metal interconnect layer 30 is formed and patterned. The structure of antifuse 40 is shown completed in FIG. 5e along with inter-metal connections in region 16a of the first metal layer.

The approach of the present invention has the advantage that the antifuse apertures are self aligned to the first metal layer since they are one integral structure formed by a single etching step where the inter-metal dielectric layer 18 itself serves as a mask for the first metal interconnect layer 16. This may not seem an obvious advantage when reviewing it with respect to AlSi or AlSiCu as discussed. However for VLSI Technology where junctions are shallow and one cannot afford to spike metal through the junction by way of segregation of silicon into aluminum, or solubility processes then a barrier metal is used. This is commonly TiW with aluminum on top. Using the described method for VLSI technology using a 1st metal of TIW/AlSi, or TiW/AlSi/TiW. This invention even serves a better purpose. The same procedures can be utilized to etch the anti fuse vias through the LTO material and through aluminum and stop at the TiW prior to depositing the intermediate material—or where a triple layer is used one would etch through the TiW—Al and stop on the TiW (1st metal). Both compatible structures that can be fused in the method discussed to form the anti fuse connection. This is the only sure way to produce a hillockless, repeatable, and compatible structure that would include barriers for shallow junctions.

The approach of the present invention is simpler, more and compatible with present dual metal CMOS, BiCMOS, Bipolar, BCD, and MOS technologies—i.e., technologies employing AlSi, AlSiCu metal layers. In addition, it comprises fewer steps, and eliminates the problems with hillocks. Finally, it actually focuses the current and shorting where it normally occurs in present antifuse structures, namely on the edge of the antifuse aperture.

The silicon nitride preferred for use as one component of the composite antifuse material layer in the antifuse of the present invention should be silicon rich, making it comparatively leaky and incapable of supporting a significant electric field. Between silicon nitride of the structure $Si_3N_4$ and amorphous silicon exists a range of compositions which may be expressed as $SiN_x$. These compositions have a characteristic like nitride but have an index of refraction that is quite high, i.e., between 2 and 5, as opposed to 2.0 for good Si$_3$N$_4$ (Silicon nitride).

The nitrides preferred for use as a component of the antifuse material layer 22 according to the present invention may be formed in a PECVD system by decreasing the ammonia in the gas mixture. Nitrides are typically formed in a PECVD process which employs an ammonia to silane gas ratio of about 6:1. As the ammonia concentration is reduced, the nitride compositions formed become silicon rich and start to "look leaky". If the ammonia concentration is reduced zero, amorphous silicon is formed.

According to the present invention, nitride compositions satisfactory for use in the present invention may be formed by employing an ammonia to silane gas ratio in the range of about 4:1 to 1:1. Within this range, leaky nitride remains easy to deposit. Other accompanying benefits are that with the use of such a process it is easy to keep the system clean, the process is easy to reproduce, and thickness control is better. Such nitride compositions well serve the purpose of the intermediate material according to the present invention: the total field applied is essentially across the nitride until rupture is reached, at which time it appears across this "leaky nitride" which cannot support the field.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An electrically programmable antifuse, including:
   a lower electrode comprising a layer chosen from the group of AlSi and AlSiCu;
   a field dielectric layer disposed over said lower electrode;
   an antifuse aperture extending completely through said field dielectric and said lower electrode;
   an antifuse material disposed in said antifuse aperture, said antifuse material comprising a multilayer structure including at least a layer of silicon nitride and a layer of amorphous silicon; and
   an upper electrode disposed above said field dielectric layer and said antifuse material.

2. The electrically programmable antifuse of claim 1 wherein said layer of amorphous silicon is hydrogenated.

3. The electrically programmable antifuse of claim 2 wherein said layer of amorphous silicon is doped.

4. The electrically programmable antifuse of claim 2 wherein said layer of amorphous silicon has a thickness in the range of from about 1,000 Å to about 5,000 Å.

5. The electrically programmable antifuse of claim 2 wherein the hydrogen content of said layer of amorphous silicon is in the range of from about 5% to about 40%.

6. The electrically programmable antifuse of claim 2 wherein the hydrogen content of said layer of amorphous silicon is about 10%.

7. The electrically programmable antifuse of claim 1 wherein said layer of amorphous silicon is doped.

8. The electrically programmable antifuse of claim 1 wherein said layer of amorphous silicon has a thickness in the range of from about 1,000 Å to about 5,000 Å.

9. An electrically programmable antifuse, including:
   a lower electrode comprising a multilayer structure chosen from the group consisting of TiW/AlSi and TiW/AlSi/Ti-W;
   a field dielectric layer disposed over said lower electrode;
   an antifuse aperture extending completely through said field dielectric and said lower electrode;
   an antifuse material disposed in said antifuse aperture, said antifuse material comprising a multilayer structure including at least a layer of silicon nitride and a layer of amorphous silicon; and
   an upper electrode disposed above said field dielectric layer and said antifuse material.

10. The electrically programmable antifuse of claim 9 wherein said layer of amorphous silicon is doped.

11. The electrically programmable antifuse of claim 9 wherein said layer of amorphous silicon is hydrogenated.

12. The electrically programmable antifuse of claim 11 wherein said layer of amorphous silicon is doped.

13. An electrically programmable antifuse, including:
    a lower electrode comprising a multilayer structure chosen from the group consisting of TiW/AlSi and TiW/AlSi/TiW;
    a field dielectric layer disposed over said lower electrode;
    an antifuse aperture extending completely through said field dielectric and said lower electrode;
    an antifuse material disposed in said antifuse aperture, said antifuse material comprising said antifuse material is a multilayer structure including a first dielectric layer, a layer of amorphous silicon over said first dielectric layer, and a second dielectric layer over said layer of amorphous silicon; and
    an upper electrode disposed above said field dielectric layer and said antifuse material.

14. The electrically programmable antifuse of claim 13 wherein said first and second dielectric layers are formed from a silicon nitride of the formula Si$_x$N$_y$:H.

15. The electrically programmable antifuse of claim 14 wherein the hydrogen content of said first and second dielectric layers is about 10%.

16. The electrically programmable antifuse of claim 14 wherein $x=3$ and $y=4$.

17. The electrically programmable antifuse of claim 14 wherein x is an integer between 1 and 3 inclusive, and y is an integer between 0 and 4 inclusive.

18. The electrically programmable antifuse of claim 13 wherein said first and second dielectric layers are formed from silicon nitride of the formula Si$_3$N$_4$.

19. The electrically programmable antifuse of claim 13 wherein said first and second dielectric layers have a thickness in the range of from about 50 to about 300 Å.

20. The electrically programmable antifuse of claim 14 wherein the hydrogen content of said first and second dielectric layers is in the range of from about 5% to about 40%.

* * * * *

UNITED STATES PATENT AND TRADEMARK OFFICE
CERTIFICATE OF CORRECTION

PATENT NO. : 5,404,029
DATED : April 4, 1995
INVENTOR(S) : John D. Husher, Abdul R. Forouhi It is certified that error appears in the above-indentified patent and that said Letters Patent is hereby corrected as shown below:

Column 2, line 48, delete "dielectric layer".

Column 3, line 6, delete "dielectric layer".

Column 3, line 37, replace the second "5a" with --5e--.

Colume 8, line 40, after the first occurrence of "and" insert --second metal interconnect layer--.

Column 8, lines 40-41, delete "second metal interconnect".

Column 9, line 9, replace "16" with --16b--.

Column 10, line 52, after "more" insert --reproducible--.

Signed and Sealed this

Twenty-first Day of May, 1996

Attest:

BRUCE LEHMAN

*Attesting Officer*    *Commissioner of Patents and Trademarks*